(12) United States Patent
Dai (10) Patent No.: US 6,180,512 B1
(45) Date of Patent: Jan. 30, 2001

(54) SINGLE-MASK DUAL DAMASCENE PROCESSES BY USING PHASE-SHIFTING MASK

(75) Inventor: Chang-Ming Dai, Hsinchu (TW)

(73) Assignee: Industrial Technology Research Institute, Hsin-Chu (TW)

(*) Notice: Under 35 U.S.C. 154(b), the term of this patent shall be extended for 0 days.

(21) Appl. No.: 09/359,903

(22) Filed: Jul. 26, 1999

Related U.S. Application Data (62) Division of application No. 08/949,353, filed on Oct. 14, 1997, now Pat. No. 5,976,968.

(51) Int. Cl.⁷ .............................................. H01L 21/4763
(52) U.S. Cl. ..................... 438/627; 438/618; 438/738; 438/622
(58) Field of Search ................................. 438/627, 638, 438/618, 622, 634, 738; 148/DIG. 20

(56) References Cited

U.S. PATENT DOCUMENTS

| | | | |
|---|---|---|---|
| 5,378,649 | 1/1995 | Huang | 437/52 |
| 5,529,953 | 6/1996 | Shoda | 437/189 |
| 5,602,053 | 2/1997 | Zheng et al. | 437/60 |
| 5,602,423 | 2/1997 | Jain | 257/752 |
| 5,614,765 | 3/1997 | Avanzino et al. | 257/774 |

OTHER PUBLICATIONS

S.Wolf et al. "Silicon Processing For The VLSI Era" vol. 1, Lattice Press, Sunset Beach, CA, 1990, p. 443.

*Primary Examiner*—Charles Bowers
*Assistant Examiner*—Scott J. Hawranek
(74) *Attorney, Agent, or Firm*—George O. Saile; Stephen B. Ackerman (57) ABSTRACT

A simplified method is disclosed for forming dual damascene patterns using a phase-shifting mask in conjunction with a single photoresist process. First, a method is descried for fabricating a phase-shifting metal mask formed on a quartz substrate having opaque, transparent and semi-light-transmitting regions. The transparent regions comprise hole pattern while the semi-transmitting regions comprise line pattern for a dual damascene pattern. Then it is shown how the phase-shifting mask is used to form a dual damascene structure by forming a single photoresist on a silicon substrate having a tri-layer insulating layer, forming the hole and line patterns on the photoresist simultaneously by exposing it through the phase-shifting mask, and then transferring the patterns successively into the top and bottom layers of the insulating layer by etching. Having thus formed the vertical hole interconnect and line trench into the insulating layer, metal is deposited into the dual damascene structure. Any excess metal on the surface of the insulating layer is then removed by any number of ways including chemical-mechanical polishing, thereby planarizing the surface and readying it for the next semiconductor process.

19 Claims, 6 Drawing Sheets

SINGLE-MASK DUAL DAMASCENE PROCESSES BY USING PHASE-SHIFTING MASK

RELATED PATENT

This is a division of patent application Ser. No. 08/949,353, filing date Oct. 14, 1997, now U.S. Pat. No. 5,976,968, Single-Mask Dual Damascene Processes By Using Phase-Shifting Mask, assigned to the same assignee as the present invention. U.S. patent application by the same inventor C. M. Dai filed Oct. 14, 1997, Ser. No. 08/949,358 entitled "Two-layered TSI Processes for Dual Damascene Patterning"; filed Oct. 14, 1997, Ser. No. 08/949,350 entitled "Dual Damascene Process Using Single Photoresist Process"; filed Oct. 14, 1997, Ser. No. 08/949,354 entitled "Self-Aligned Dual Damascene Patterning Using Developer Soluble ARC Interstitial Layer"; and filed Oct. 14, 1997, Ser. No. 08/949,352 entitled "Opposed Two-Layered Photoresist Process for Dual Damascene Patterning", assigned to common assignee.

BACKGROUND OF THE INVENTION

1. Field of the Invention

The present invention relates to the manufacture of ultra large scale (ULSI) integrated chips (IC) in general, and in particular, to the fabrication of metal lines and vias in a semiconductor substrate by using a single phase-shifting mask applied to dual damascene process.

2. Description of the Related Art

Masks in general are tools that are used to delineate the size and shape of features that form the integrated circuits in a semiconductor chip. Ultimately, the level of integration of chips, whether they are ULSI or VLSI (very large scale integrated) is determined by how small and how precisely the images of those features can be formed on a mask and then transferred onto the semiconductor substrate from which the chips are fabricated. As the number of features, such as devices, metal lines and interconnections have been increasing dramatically, along with the number of semiconductor layers to accommodate the increasing number of components, the issue of the number of masks as well as the number of mask processes that are needed has gained importance in the semiconductor industry. This invention discloses a method for combining two masks into one in a dual damascene process where the advantages of the single mask are realized as explained below.

In related art, Damascene process, or inlaid metal patterning in pre-formed grooves, is usually a preferred method of fabricating interconnections for an integrated circuit. Unlike with Damascene interconnections which will be described more in detail later, the more conventional interconnections are formed by blanket depositing a conductive material on an insulation layer such as silicon oxide, and then etching the desired wiring pattern on the layer. The vertical connections between the wiring layers are made separately by forming holes in the insulation layers separating the metallized layers and then filling them with the same or a different conductive material. It will be appreciated that as the number of wiring layers increase, the number of masks required will also increase proportionately.

Normally, a semiconductor chip contains one or more metal wiring layers that are separated from each other by an insulating layer and are further separated by still another insulating layer from the devices that are formed near the surface of the semiconductor that forms the base of the chip. The wiring stripes are connected to each other and to the devices at the appropriate places by means of holes that are filled with metal through the insulating layers. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist formed on the metal layer. For the first metal layer, electrical contact is made with the underlying devices through contact holes, or windows, that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

To provide robust contact area at the junction where the metal lines contact the devices or the via plugs in the case of multilayer wiring, it is usually necessary to increase the dimensions of the various features in he metal line and the holes to compensate for overlay errors and process bias inherent in lithographic process. This increase in the size of the design ground rules results in a significant loss in circuit layout density. Furthermore, there is considerable development effort expended on photolithographic equipment and processes to make improvement in overlay error and process tolerances. To minimize the chip area devoted to overlay tolerance and lithography costs, several "self-aligned" processes have been developed by workers in the field.

There are also other problems associated with forming contacts between metal layers in a substrate. Where contact windows are etched into a dielectric layer, the sides of the contact windows must be sloped to guarantee good continuity of the metal layer as it descends into the contact window. The steeper the slope, the more likely it is the metallurgy will have breaks at the edges of the contact windows. However, the use of a gradually sloped sidewall to guarantee metal line continuity takes up valuable chip area and prevents contact windows from being packed as closely as desired. In addition, the use of contact windows creates an irregular and nonplanar surface which makes it difficult to fabricate the subsequent interconnecting layers as shown in FIG. 1.

Figure 1:
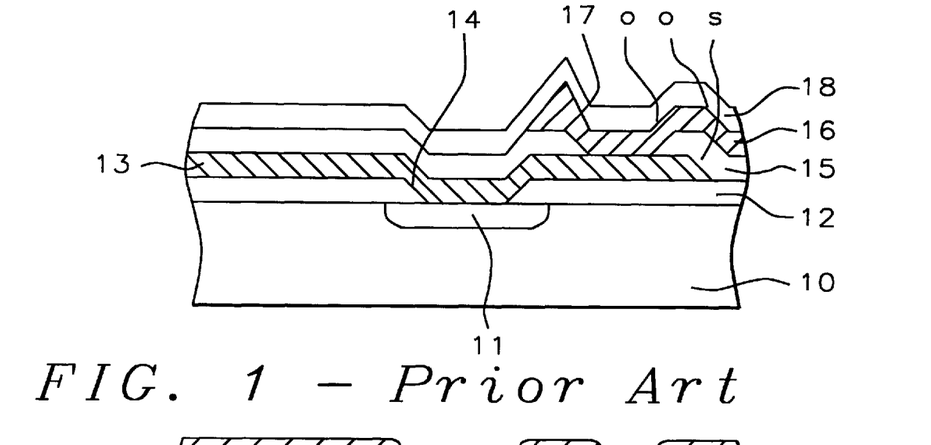
FIG. 1 is a partial cross-sectional view of a semiconductor substrate showing a non-planar multilayered metal structure resulting from prior art methods.

The structure shown in FIG. 1 is a typical example of a semiconductor substrate fabricated using prior art techniques. After having defined device regions represented by reference (11) on substrate (10), a first insulating layer (12) is formed and patterned thereon. First level metal layer (13) is next deposited to make contact with region (11) through contact window (14). Similarly, the second level metal layer (16) makes contact with metal layer (13) through via hole (17) patterned in second insulating layer (15). The structure is passivated with a third insulating layer (18). Although the structure depicted in FIG. 1 is not to scale, it exemplifies a very irregular surface which creates reliability problems. One such problem is the potential short at location (S) between the first and second levels of metal layers, due to the thinning of the insulating layer therebetween, and still another one is the risk of a potential open circuit at locations (O), due to the thinning of the metal layer at that location.

One solution that is found in prior art in addressing the problems cited above is the dual damascene process. In its simplest form, this process starts with an insulating layer which is first formed on a substrate and then planarized. Then horizontal trenches and vertical holes are etched into the insulating layer corresponding to the required metal line pattern and hole locations, respectively, that will descend down through the insulating layer to the underlying features, that is, to device regions if through the first insulating layer, or to the next metal layer down if through an upper insulating layer in the substrate structure. Metal is next deposited over the substrate thereby filling the trenches and the holes, and hence forming metal lines and the interconnect holes simultaneously. As a final step, the resulting surface is planarized using the well-known chemical-mechanical polish (CMP), and readied to accept another dual damascene structure, that is, integrally inlaid wiring both in the horizontal trenches and vertical holes, hence the duality of the process.

Figure 2A:
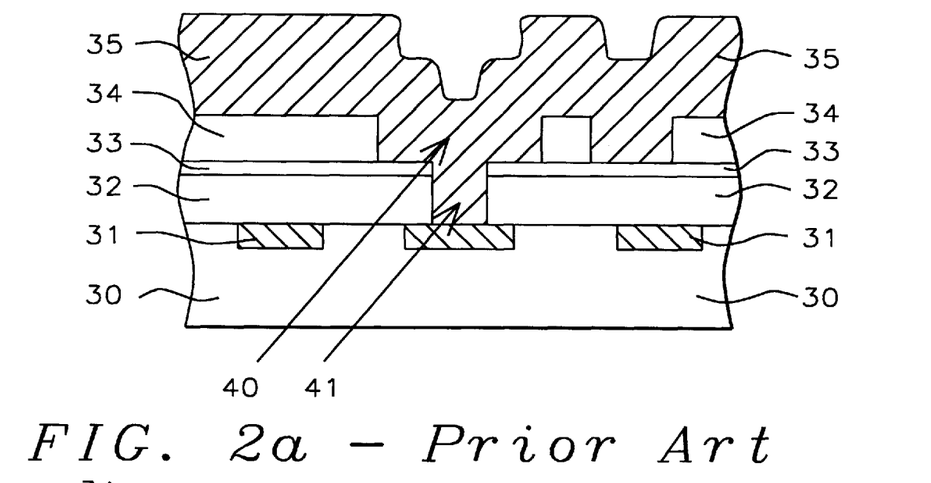
FIGS. 2a–2b are partial cross-sectional views of a semiconductor substrate showing the conventional forming of a dual damascene structure before and after planarization.
Figure 2B:
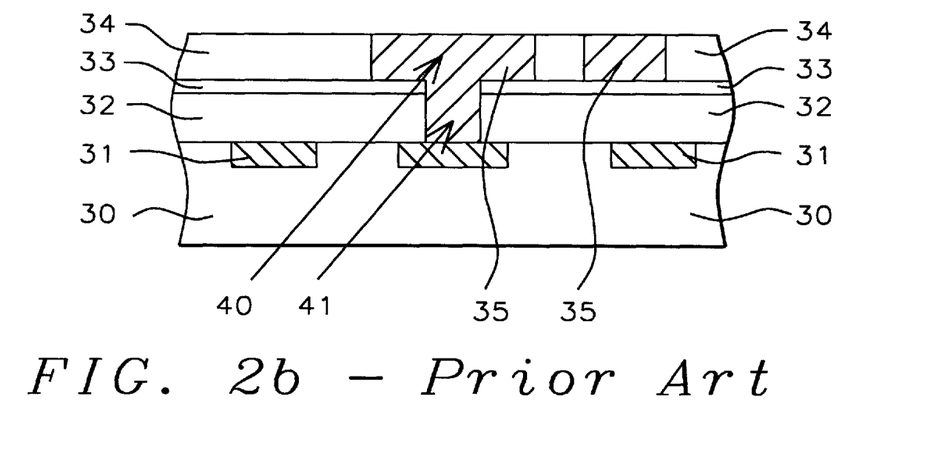

A dual damascene structure before and after CMP is shown in FIG. 2a and FIG. 2b. Two photolithographic processes and two insulator layers separated by an etch stop layer are employed to achieve the shown structure as follows: a starting planarized surface (30) is provided with patterned first level metal (31). A first layer of insulator (32) is deposited over a fist level of patterned metal to which contacts are to be selectively established. The first layer is planarized and then covered by an etch stop material (33). Contact holes are defined in the etch stop material by a first photolithography at locations where vertical plug interconnects are required. The thickness of the first insulator layer (32) is made equal to the desired plug height. The first insulator layer is not etched at this time. Next, a second insulator layer (34), having a thickness equal to the thickness of the second level of patterned metal of the mullet-level structure, is deposited over the etch stop material (33). The second insulator layer (34), in turn, is etched by second photolithography down to the etch stop material (33) to define desired wiring channels (40), some of which will be in alignment with the previously formed contact hole (41) in the etch stop material. In those locations where the contact holes are exposed, the etching is continued into the first insulator layer to uncover the underlying first level of patterned metal. The horizontal channels and vertical holes etched into the second and first insulator layers are next overfilled with metal (35). As a final step, excess metal (35) on top of the second insulator layer (34) but not in the channels (40) or holes (41) is removed by etching or chemical-mechanical polishing, as shown in FIG. 2b.

It will be appreciated by those skilled in the art that the dual damascene process alleviates the problem of registration of holes with metal lines, and the concomitant contact problems along with the issue of excessive overlay tolerances. At the same time, wiring can be kept to the minimum ground rules tolerances and also problems associated with the thinning of insulator and/or metal around sloped holes can be circumvented. However, it is also evident that the process is complicated, especially in the area where two photolithographic steps must be performed to form the vertical holes. Here, the hole pattern must first be defined lithographically after the etch stop has been formed, and also later when the line is etched lithographically. Furthermore, two photoresist processes must be used to form the hole and line patterns. The multiplicity of the processes results in lower productivity, and increased cost.

Nevertheless, in prior art, some of the dual damascene steps have been used to advantage. For example, Huang in U.S. Pat. No. 5,378,649 teaches to form two sets of resist patterns through a double photoloithograhpic process in order to form metal lines over buried bit lines so as to better protect the bit lines from code implants. An improved dual damascene structure is also provided by Jain in U.S. Pat. No. 5,602,423 where through lithographic means he introduces support columns or pillars embedded in the damascene conductors inlaid in the trenches so that during the abrasive chemical-mechanical polishing, the pillars prevent the excessive removal or dishing of the conductors in areas where the conductors may span relatively long distances. Shoda, on the other hand, discloses in U.S. Pat. No. 5,529,953 a method of manufacturing a stud (vertical metal plug) and (horizontal) interconnect in a dual damascene structure using selective deposition where the selective deposition is accomplished through repeated application of masks and photolithographic processes. Similarly, Zheng in U.S. Pat. No. 5,602,053 discloses still another dual damascene antifuse structure where sandwiched layers are formed.

In still another approach, recognizing the multiplicity of mask patterning steps in dual damascene process, Avanzino in U.S. Pat. No. 5,614,765 teaches the use of one mask pattern for the formation of both the conductive lines and the vias simultaneously. Though only one mask, the process of forming the conductive lines and the vertical vias on the substrate itself becomes complicated due to the nature of the design of the mask. What is needed is a different type of a mask, as disclosed in this invention, having regions of different light transmissivity corresponding to the line trenches and vertical holes in order to simplify and improve the image transfer to the underlying substrate.

SUMMARY OF THE INVENTION

It is therefore an object of this invention to provide a simplified method of forming dual damascene patterns using a single phase-shifting mask in conjunction with single photoresist process in the manufacture of semiconductor substrates and chips.

It is another object of this invention to provide a method for fabricating a phase-shifting mask.

It is still another object of this invention to provide a method for improving the alignment of a wiring layer to underlying interconnect hole pattern.

It is yet another object of this invention to provide a method for reducing overlay tolerances and process bias in order to increase the packing density of ultra large scaled integrated chips.

These objects are accomplished by providing a quartz substrate; depositing a layer of metal over said quartz substrate; depositing a first layer of photoresist over said layer of metal; patterning said first layer of photoresist with a first pattern; etching said layer of metal through first pattern; removing said first layer of photoresist; depositing a second layer of photoresist over said quartz substrate; patterning said second layer of photoresist with a second pattern; etching said quartz substrate to a controlled thickness through said second pattern to form a phase-shifting mask; and removing said second layer of photoresist.

These objects are further accomplished by providing a silicon substrate having a composite layer of insulation deposited thereon whereby said composite layer comprises a first layer of dielectric separated from a second layer of dielectric by an intervening intermediate layer of dielectric; forming a layer of photoresist on said composite layer of dielectric insulation; patterning said layer of photoresist by exposing said photoresist using a phase-shifting mask comprising hole and line patterns; post-exposure baking of said layer of photoresist; performing a wet development of said layer of photoresist; etching said second layer of dielectric underlying said layer of photoresist using said patterned layer of photoresist as a mask thereby transferring said hole pattern in said layer of photoresist into said second layer of dielectric; etching said intermediate layer of dielectric underlying said second layer of dielectric using said layer of photoresist as a mask thereby transferring said hole pattern in said layer of photoresist into said intermediate layer of dielectric; etching said layer of photoresist to extend downward said line pattern; etching said composite layer of insulation thereby transferring said line pattern in said layer of photoresist into said second layer of dielectric to form a line trench, and simultaneously transferring said hole pattern in said intermediate layer of dielectric into said first layer of dielectric to form a hole; removing said layer of photoresist; and depositing metal into said trench and said hole to form a dual damascene structure.

BRIEF DESCRIPTION OF THE DRAWINGS

In the accompanying drawings, similar numerals refer to similar parts throughout the several views.

DESCRIPTION OF THE PREFERRED EMBODIMENTS

Referring now to the drawings, in particular to FIGS. 3a–3h, and FIGS. 4a–4e, there are shown schematically steps of forming a phase-shifting mask and a dual damascene pattern employing a single layer photoresist process, respectively.

Figure 3A:
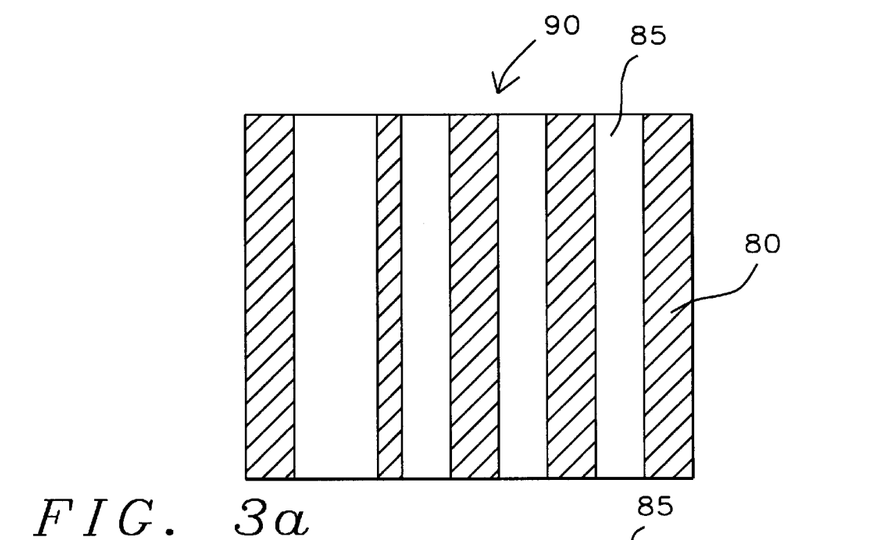
FIG. 3a is a top view of a quartz metal mask showing line patterns formed in a layer of photoresist, according to this invention.
Figure 3B:
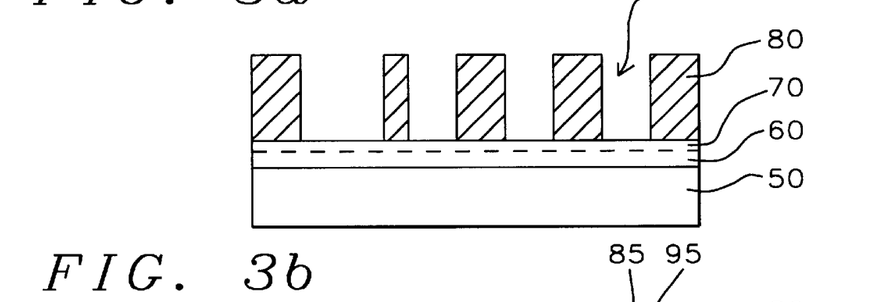
FIG. 3b is a cross-sectional view of quartz metal mask of FIG. 3a showing metal layers and the forming of line pattern in the photoresist layer thereon, according to this invention.
Figures 3C, 3D:
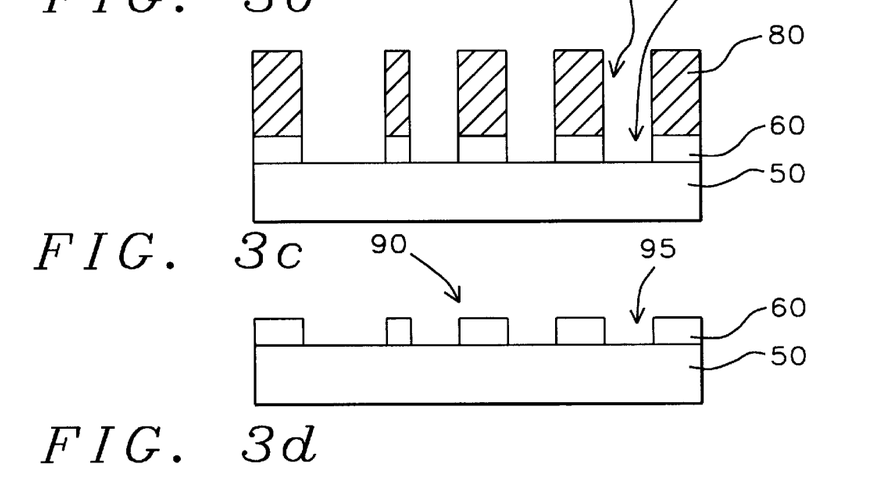
FIG. 3c is a cross-sectional view of quartz metal mask of FIG. 3b showing the forming of line pattern in the metal layers, according to this invention.
FIG. 3d is a cross-sectional view of quartz metal mask of FIG. 3c showing the line pattern after the removal of the photoresist layer according to this invention.

In FIG. 3a, a top-view of a metal mask (90) is shown comprising a quartz substrate (50) and metal layer (60) which are better seen in the cross-sectional view in FIG. 3b. Preferably the thickness of quartz substrate is between about 6 to 7 millimeters (mm) and is coated with metal layer chromium (Cr) with a thickness between about 1000 to 1500 angstroms Cr layer (60) is next covered with a photoresist, and then exposed and developed to form line pattern (85) as shown in FIGS. 3a and 3b. Then using, preferably, a wet-etch solution comprising 9% [Cl(NH$_4$)$_2$(NO)$_3$], 86% [H$_2$O] and 5% [HCl], line pattern (85) is replicated as (95) in metal layers (70) and (60). Reactive ion etch (RIE) can also be used with BCl$_3$ and Cl$_2$. After stripping photoresist layer (80), metal mask (90) containing line pattern (95) is formed as shown in FIG. 3d.

Figure 3E:
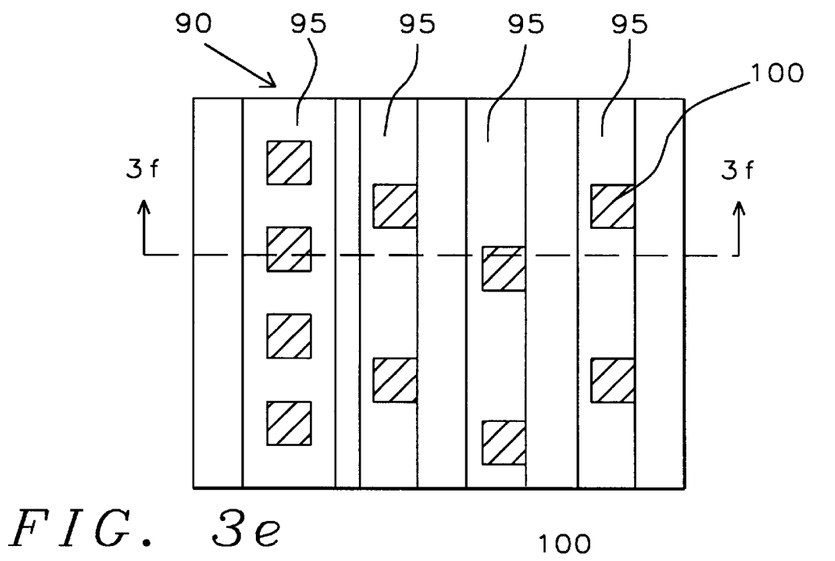
FIGS. 3e–3h show the forming of hole pattern in the quartz metal mask of FIGS. 3a–3d, and the completion of the phase-shifting mask of this invention.
Figure 3F:
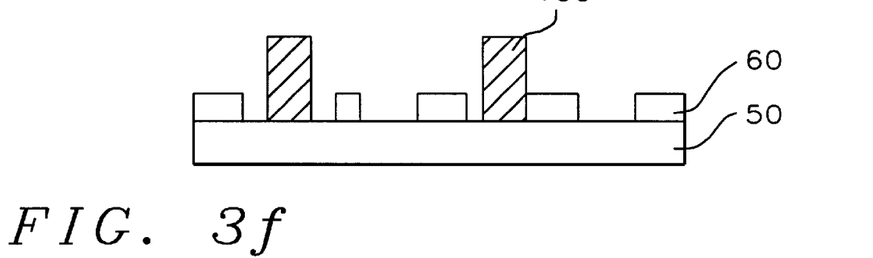
Figure 3G:
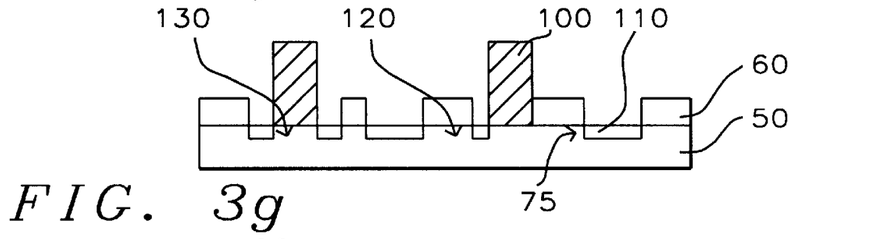

Hole pattern on mask (90) shown in FIG. 3e is next formed by first applying, preferably, a negative photoresist (used for electron beam (e-beam) writing) on the mask, exposing and developing (not shown) the photoresist to delineate hole areas in photoresist structures (100), as shown in FIG. 3f, and then etching quartz substrate (50). Quartz etching is accomplished in a high density plasma (HDP) oxide etcher with a recipe comprising gases Ar, CHF$_3$ and C$_4$F$_8$ at a flow rate between about 50 to 150 standard cubic centimeter per minute (sccm), 10 to 50 sccm, and 0 to 22 sccm, respectively. It is critical that the depth (75) to which the quartz is etched is between about 200 to 2000 Å. In this manner, a phase-shift of between about 70 to 110° is achieved in regions (110) shown in FIGS. 3g and 3h so that the transmissivity of light passing through regions (110) are differentiated from regions (120) under the metal layer and from regions (130) not exposed to etching under the photoresist layer (100).

Figure 3H:
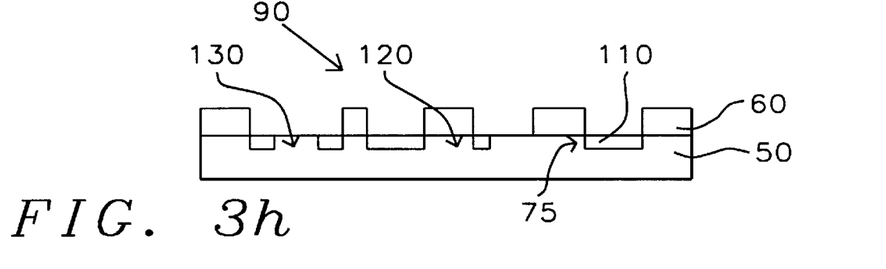

Thusly formed metal mask (90) shown in FIG. 3h, containing three regions, namely, opaque region (120), open hole region (130), and semi-transmitting region (110) is now advantageously used to form a dual damascene pattern with a single photoresist process as described in relation to FIGS. 4a–4e. Specifically, hole area (130), which has 100% light transmittance, is used as contact (or via) patterns (100) on substrate or wafer in FIGS. 4a–4e, while the etched quartz area (110), which has transmissivity between about 10% to 34% relative to hole area (130) is used as line patterns (95) on the wafer. In area (120), which has 0% transmissivity, the resist is not exposed at all. It will be appreciated that hole pattern (100) is self-aligned with line pattern (95) as shown in FIGS. 3e–3h. And metal mask (90) of FIG. 3h is schematically represented by (90') in FIG. 4b where the opaque, semi-transmitting and open regions are represented by (120'), (110') and (130'), respectively.

Figure 4A:
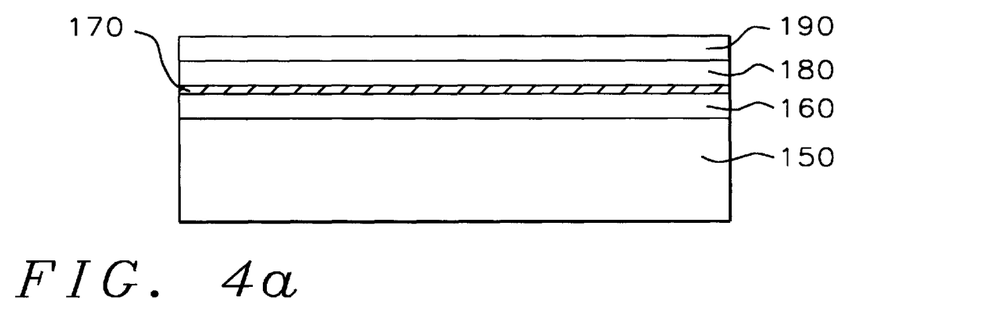
FIG. 4a is partial cross-sectional view of a semiconductor substrate having a photoresist layer formed on a composite layer of insulation according to this invention.

In FIG. 4a substrate (150), preferably silicon, is provided with a composite tri-layer dielectric insulation comprising bottom and top layers (160) and (180), respectively, and a middle layer (170). A layer of photoresist (190) is next formed on the composite layer.

It is preferred that top and bottom layers of insulation, that is, layers (160) and (180), are plasma enhanced chemical vapor deposited (PECVD) phosphosilicate glass (PSG) in a low pressure environment at a chamber pressure between about 0.5 to 10 torr, temperature between about 300° C. to 600° C. with reactant gas $SiH_4$ at a flow rate between about 100 to 500 standard cubic centimeters per minute (sccm) in a diluent carrier gas $PH_3$ at a flow rate between about 20 to 300 sccm. The thickness of bottom (160) and top (180) layers of dielectric are between about 0.3 to 0.7 micrometers ($\mu$m).

Middle layer (170) is an etch barrier film such as silicon nitride (SiN) to prevent the upper trench (line) patterns of dual damascene from being etched through if the layer underlying the composite insulation layer is the device contact or via area (not shown). (It will briefly be noted here that substrate (150) in FIG. 4a is provided with a substructure of devices formed in the substrate and/or metal layers thereof, and as they are not significant to the invention, they are not described in detail in order not to unnecessarily obscure the present invention.) Other barrier films may be used, however silicon nitride is preferred because it becomes part of the composite insulation layer and has different etch characteristics than oxide regions. That is, silicon nitride allows a selective etch process with respect to different underlying materials. Spin-on-glass and plasma nitride are also suitable as etch stop materials when polyimide layers are used. It is preferred that silicon nitride be deposited using plasma enhanced PEVCD and that it has a thickness between about 500 to 2000 angstroms (Å).

The surface of layer (180) in FIG. 4a is planarized, preferably using chemical-mechanical polishing process. Etching back or using capping method are also suitable for planarizing the surface of layer (180). Then, a layer of photoresist (190) is formed on PSG layer (180). It is preferred that photoresist (190) is a chemical amplification resist (CAR) and it is of positive (p)-type. The CAR is made using a photo acid generator (PAG) instead of the conventional photosensitive agent, and an example of (p)-type resist is, model 4100 series made by Shin-etsu Corporation in Japan.

Figure 4B:
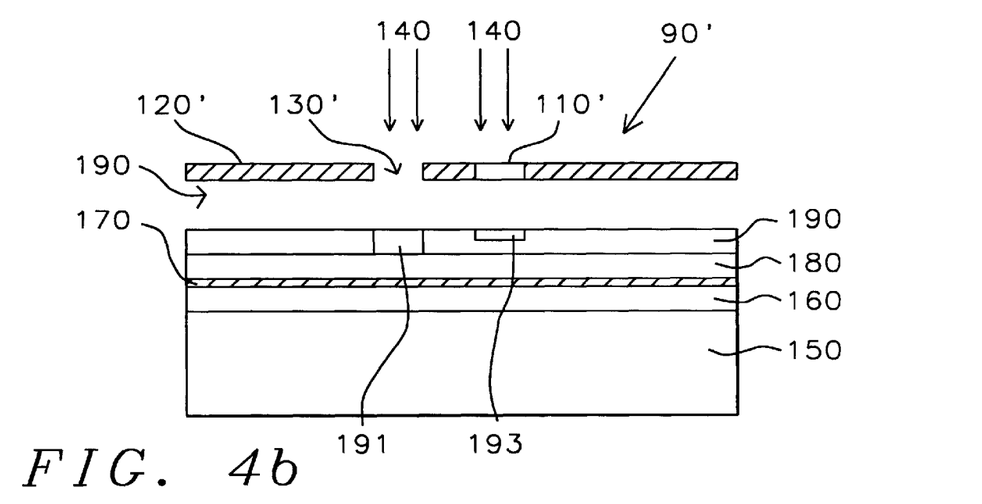
FIGS. 4b–4c are partial cross-sectional views of a semiconductor substrate showing the photo-exposing of the photoresist layer of FIG. 4a using the phase-shifting mask of FIG. 3h for simultaneous patterning of the layer of photoresist with hole and line patterns, according to this invention.
Figure 4C:
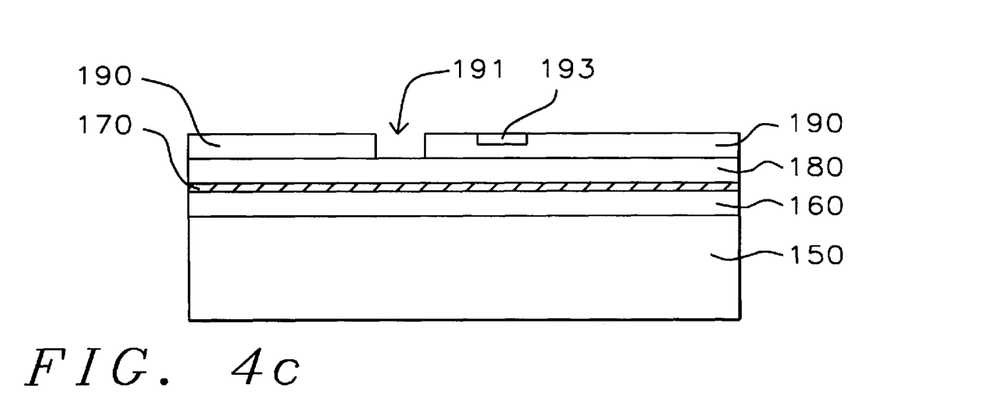

The preferred thickness of layer of photoresist (190) shown in FIG. 4a is between about 0.7 to 1.0 $\mu$m. Mask (90') is next used to expose photoresist layer (190). It will be recalled that mask (90') contains opaque, semi-transmitting and clear regions (120'), (110') and (130'), respectively. Region (130') corresponds to the hole pattern and region (110') to the line pattern. Thus, when photoresist layer (190) is exposed by light (140) through mask (90'), hole pattern (191) and line pattern (193) are formed in photoresist layer (190) as shown in FIG. 4b. However, as a main feature of this invention, because region (110') transmits only a portion of light, line pattern is delineated only partially through the photoresist as shown in FIG. 4b. The depth to which the pattern is delineated into the photoresist layer is a function of the transmissivity of the mask. In other words, the photoacid generator (PAG) in the photoresist generates acid commensurate with the amount of light received and alters the resin in the photoresist accordingly. The exposure energy is between about 20 to 60 milijoules (mj)/$cm^2$. It is preferred that the transmissivity of region (140') is between about 5 to 30 percent, though lower transmissivities down to 5 percent are acceptable while region (140) has 100% transmittance. Photoresist (190) is next developed with a recipe comprising developer 2.38% TMAH in a stream puddle for about 40 to 70 seconds thus forming the hole and line patterns to different depths in the photoresist as shown in FIG. 4c and then subjected to a post-exposure bake at a temperature between about 90 to 110° C. (See S. Wolf and R. N. Tauber, "Silicon Processing for the VLSI Era," vol. 1, Lattice Press, Sunset Beach, Calif., 1986, p. 443 for a discussion on the use of stream puddle technique).

Figure 4D:
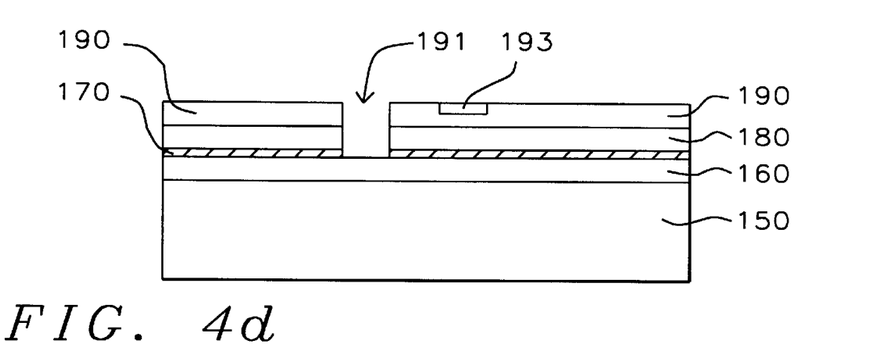
FIG. 4d is a partial cross-sectional view of a semiconductor substrate showing the transferring of the hole pattern in the layer of photoresist of FIG. 4c into the middle layer of the composite layer, according to this invention.

In accordance with a key feature of this invention, the same single layer of photoresist (190) may now be used as a mask to dry etch the top oxide layer (180) and thereby transfer the hole pattern as shown in FIG. 4d. It is preferred that the recipe used for dry etching the oxide layer in a high density plasma (HDP) etcher comprises Ar, $CHF_3$ and $C_4F_8$ at a flow rate of standard cubic centimeters per minute (sccm) between about 50 to 150, 10 to 50 and 0 to 22 sccm, respectively. The recipe is next changed to a recipe comprising Ar, $CHF_3$ and $CF_4$ at a flow rate between about 50 to 150, 0 to 100 and 0 to 50 sccm, respectively in order to etch the SiN layer (170) in a nitride etcher. It is also preferred that the etching selectivity of oxide is higher than ten so that the thickness of the photoresist is maintained while etching the oxide layer.

Figure 4E:
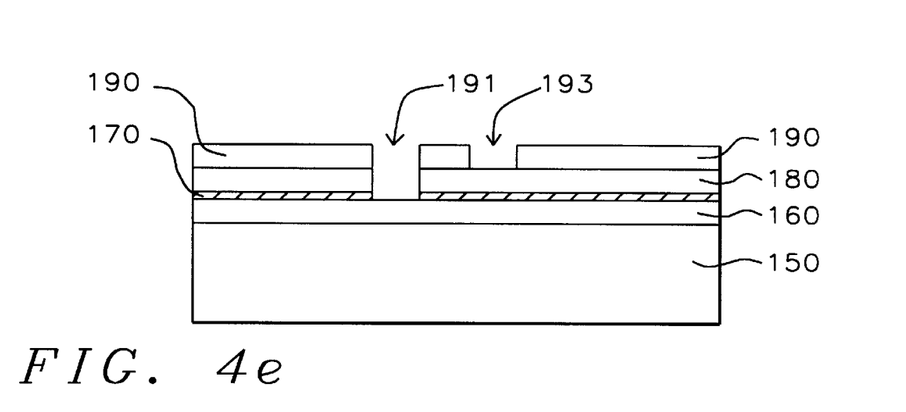
FIG. 4e is a partial cross-sectional view of a semiconductor substrate showing the forming of the line pattern in the layer of photoresist of FIG. 4d, according to this invention.
Figure 4F:
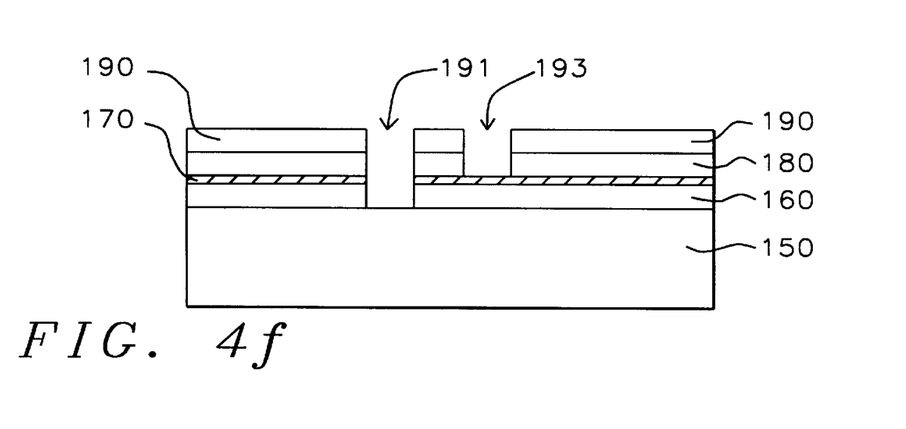
FIG. 4f is a partial cross-sectional view of a semiconductor substrate showing the transfer of line pattern in the layer of photoresist into the top layer of the composite layer to form a line trench, and the simultaneous transfer of the hole pattern in the middle layer of the composite layer into the bottom layer of FIG. 4e to form a interconnect hole according to this invention.

Line pattern (193) in photoresist layer (190) is next extended down to the top of oxide layer (180) in a resist HDP etcher using a resist dry etch recipe comprising $O_2$, He and $CF_4$ at a flow rate between about 10 to 250, 40 to 80 and 0 to 50 sccm, respectively. It will be appreciated that in this important step, any resist residue in either the hole pattern (191) or in the line pattern (193) will be anisotropically removed. Subsequently, the same photoresist layer used to form hole pattern (191) is now used to transfer line pattern (193) into the top oxide layer (180). This is accomplished while simultaneously transferring hole pattern (191) into the lower oxide layer (160) by etching in a HDP oxide etcher using a recipe comprising gases Ar, $CHF_3$ and $C_4F_8$ at a flow rate between about 50 to 150 sccm, 10 to 50 sccm, and 0 to 22 sccm, respectively.

Figure 4G:
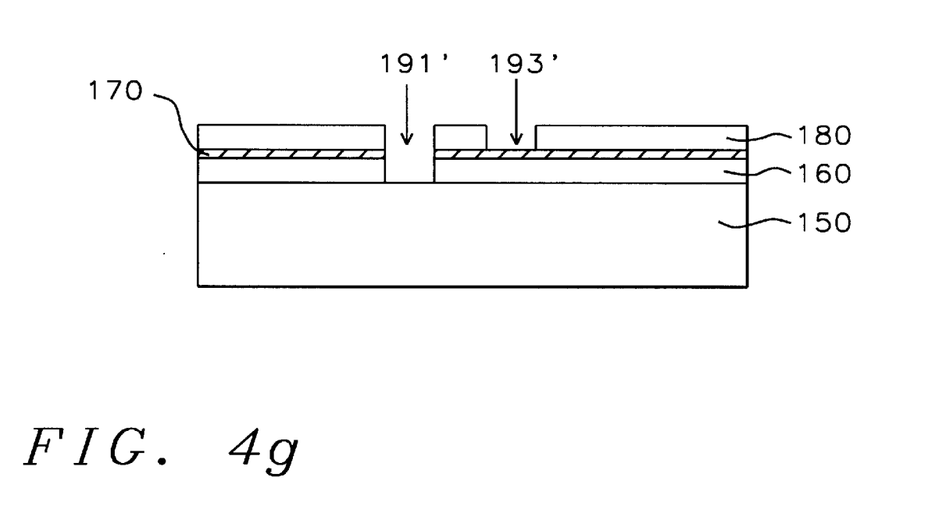
FIG. 4g is a partial cross-sectional view of a semiconductor substrate showing the dual damascene pattern in the composite insulation layer after the removal of the photoresist layers of FIG. 4f.
Figure 4H:
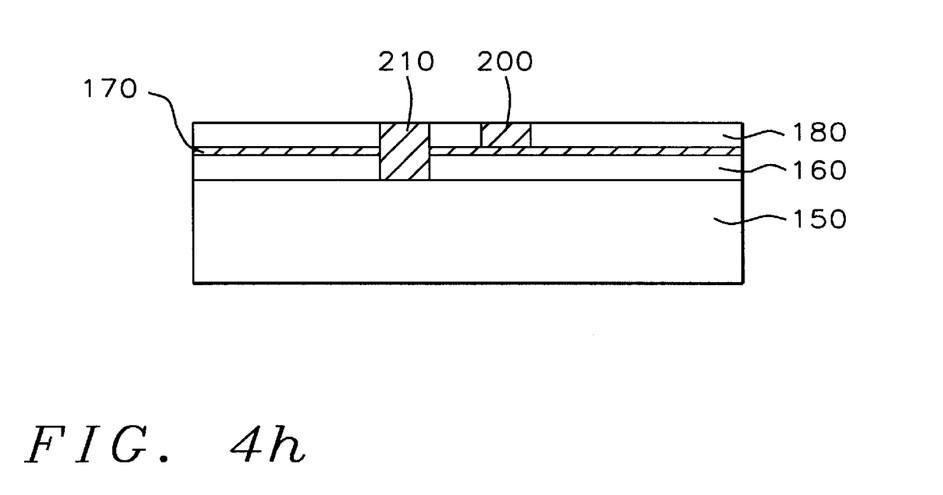
FIG. 4h is a partial cross-sectional view of a semiconductor substrate showing the depositing of metal into trench and hole of FIG. 4g to form a dual damascene structure according to this invention.

FIG. 4g shows the dual damascene structure comprising line trench (193') and vertical hole (191') thus formed with a single layer of photoresist which has now been removed. The dual damascene metal interconnect of FIG. 4h is finally formed by depositing metal 200, 210 into the horizontal line trench and vertical hole combination, respectively, in the composite insulation layer and planarizing the same. It will be understood that the vertical hole may represent a contact hole or a via hole depending upon the nature of the underlying layer, that is, whether the underlying layer is the silicon substrate itself or a wiring layer.

While the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene pattern employing a single photoresist layer comprising the steps of:

providing a substrate having a composite layer of insulation deposited thereon whereby said composite layer comprises a first layer of dielectric separated from a second layer of dielectric by an intervening intermediate layer of dielectric;

forming a layer of photoresist on said composite layer of dielectric insulation;

patterning said layer of photoresist by exposing said photoresist using a phase-shifting mask comprising hole and line patterns;

post-exposure baking of said layer of photoresist;

performing a wet development of said layer of photoresist to form a patterned layer of photoresist;

etching said second layer of dielectric using said patterned layer of photoresist as a mask thereby transferring said hole pattern in said layer of photoresist into said second layer of dielectric;

etching said intermediate layer of dielectric underlying said second layer of dielectric using said layer of photoresist as a mask thereby transferring said hole pattern in said layer of photoresist into said intermediate layer of dielectric;

etching said layer of photoresist to extend downward said line pattern;

etching said composite layer of insulation thereby transferring said line pattern in said layer of photoresist into said second layer of dielectric to form a line trench, and simultaneously transferring said hole pattern in said intermediate layer of dielectric into said first layer of dielectric to form a hole;

removing said layer of photoresist; and depositing metal into said trench and said hole to form a dual damascene structure.

2. The method of claim 1, wherein said composite layer of insulation is planarized by means of chemical-mechanical polishing (CMP).

3. The method of claim 1, wherein said first layer of dielectric of said composite layer is phosphosilicate glass (PSG) having a thickness between about 0.3 to 0.7 micrometers ($\mu$m).

4. The method of claim 1, wherein said intermediate layer of dielectric is silicon nitride (SiN) having a thickness between about 500 to 2000 angstroms (Å).

5. The method of claim 1, wherein said second layer of dielectric of said composite layer is phosphosilicate glass (PSG) having a thickness between about 0.3 to 0.7 micrometers ($\mu$m).

6. The method of claim 1, wherein said layer of photoresist has a thickness between about 0.70 to 1.0 $\mu$m.

7. The method of claim 1, wherein said layer of photoresist is a positive chemical amplification resist (CAR) having a photo acid generator (PAG) component.

8. The method of claim 1, wherein said phase-shifting mask has regions that are opaque, semi-transmitting of light, and open.

9. The method of claim 8, wherein said open regions comprise hole pattern.

10. The method of claim 8, wherein said semi-transmitting regions transmit light between about 10 to 34 percent with a phase shift between about 70 to 110 degrees.

11. The method of claim 8, wherein said semi-transmitting regions comprise line pattern.

12. The method of claim 1, wherein said post-exposure baking of said layer of photoresist is accomplished at a temperature between about 90 to 110° C.

13. The method of claim 1, wherein said wet development of said layer of photoresist is accomplished with a recipe comprising developer TMAH with stream puddle for about 40 to 70 seconds.

14. The method of claim 1, wherein said etching said second layer of dielectric underlying said layer of photoresist using said patterned layer of photoresist as a mask thereby transferring said hole pattern in said layer of photoresist into said second layer of dielectric is accomplished in a HDP oxide etcher with etch recipe comprising gases Ar, $CHF_3$ and $C_4F_8$ at a flow rates between about 50 to 150 (sccm), 10 to 50 sccm, and 0 to 22 sccm, respectively.

15. The method of claim 1, wherein said etching said intermediate layer of dielectric underlying said second layer of dielectric using said layer of photoresist as a mask thereby transferring said hole pattern in said layer of photoresist into said intermediate layer of dielectric is accomplished in a HDP nitride etcher using etch recipe comprising Ar, $CHF_3$ and $CF_4$ at flow rates between about 50 to 150, 0 to 100 and 0 to 50 sccm, respectively.

16. The method of claim 1, wherein said etching said layer of photoresist to extend downward said line pattern is accomplished with recipe comprising $O_2$, He and $CF_4$ at flow rates between about 10 to 250, 40 to 80 and 0 to 50 sccm, respectively.

17. The method of claim 1, wherein etching said composite layer of insulation thereby transferring said line pattern in said layer of photoresist into said second layer of dielectric to form a line trench, and simultaneously transferring said hole pattern in said intermediate layer of dielectric into said first layer of dielectric to form a contact hole is accomplished in a HDP oxide etcher with etch recipe gases Ar, $CHF_3$ and $C_4F_8$ at flow rates between about 50 to 150 (sccm), 10 to 50 sccm, and 0 to 22 sccm, respectively.

18. The method of claim 1, wherein said removing said layer of photoresist is accomplished with etch recipe comprising $O_2$ plasma ashing and then stripping resist by $H_2SO_4$ and $H_2O_2$ solutions.

19. The method of claim 1, wherein said metal deposited to form a dual damascene structure is copper or aluminum-copper alloy.

* * * * *